(12) United States Patent
Roberts

(10) Patent No.: US 7,551,448 B2
(45) Date of Patent: Jun. 23, 2009

(54) ELECTRONIC DEVICE HAVING IMPROVED ELECTRICAL CONNECTION

(75) Inventor: William P. Roberts, Spartanburg, SC (US)

(73) Assignee: Cryovac, Inc., Duncan, SC (US)

( * ) Notice: Subject to any disclaimer, the term of this patent is extended or adjusted under 35 U.S.C. 154(b) by 534 days.

(21) Appl. No.: 11/343,296

(22) Filed: Jan. 31, 2006

(65) Prior Publication Data

US 2007/0177359 A1    Aug. 2, 2007

(51) Int. Cl.
H05K 1/14    (2006.01)

(52) U.S. Cl. .................. 361/737; 361/800; 361/807

(58) Field of Classification Search .............. 361/737, 361/727, 761, 748, 679, 816, 818, 800, 600, 361/807, 753, 752; 439/630, 625, 66, 55, 439/629
See application file for complete search history.

(56) References Cited

U.S. PATENT DOCUMENTS

| | | | |
|---|---|---|---|
| 3,686,612 A | 8/1972 | Clements | |
| 4,468,074 A | 8/1984 | Gordon | |
| 4,647,125 A * | 3/1987 | Landi et al. | 439/67 |
| 4,655,524 A | 4/1987 | Etzel | |
| 4,691,972 A | 9/1987 | Gordon | |
| 4,717,345 A | 1/1988 | Gordon et al. | |
| 4,744,764 A | 5/1988 | Rubenstein | |
| 4,752,247 A | 6/1988 | Warnars | |
| 4,768,971 A | 9/1988 | Simpson | |
| 4,913,656 A | 4/1990 | Gordon et al. | |
| 5,219,303 A | 6/1993 | Daly et al. | |
| 5,306,546 A | 4/1994 | Schreiber et al. | |
| 5,313,848 A | 5/1994 | Santin et al. | |
| 5,450,664 A | 9/1995 | Babow et al. | |
| 5,519,201 A | 5/1996 | Templeton, Jr. et al. | |
| 5,677,568 A * | 10/1997 | Ochi et al. | 257/679 |
| 5,885,091 A | 3/1999 | Belanger, Jr. et al. | |
| 5,986,886 A | 11/1999 | Sasov | |
| 6,007,669 A | 12/1999 | Crumly et al. | |
| 6,027,958 A | 2/2000 | Vu et al. | |
| 6,288,905 B1 | 9/2001 | Chung | |
| 6,293,470 B1 | 9/2001 | Asplund | |
| 6,302,704 B1 | 10/2001 | Belanger, Jr. | |
| 6,320,512 B1 | 11/2001 | Nicholson et al. | |
| 6,411,916 B1 | 6/2002 | Pellerin | |

(Continued)

OTHER PUBLICATIONS

KSW—TempSens®, "The Smart Label with Temperature Monitoring Function," Smart & Active Technologies by KSW Microtec brochure, 3 pages.

Primary Examiner—Hung S Bui
(74) Attorney, Agent, or Firm—Alston & Bird LLP

(57) ABSTRACT

The invention is directed to a method and apparatus for electrically interconnecting multiple electronic components together by disposing the electronic components between two opposing plurality of protrusions that hold the electrical components together and establish an electrical connection therebetween. Each plurality of protrusions may be disposed in an offset arrangement with the opposing protrusions. The opposing protrusions cause the electronic components to bend and adopt a deflected geometry when they are positioned between the opposing sets of protrusions. This bending results in the electronic components being biased against each other so that electrical contacts on each electronic component may be held together and thereby form an electrical connection. As a result, the opposing sets of protrusions can be used to electrically interconnect a plurality of electrical components in the absence of clamping, adhesion, soldering, or pinching.

23 Claims, 5 Drawing Sheets

U.S. PATENT DOCUMENTS

| | | | |
|---|---|---|---|
| 6,462,955 B1 * | 10/2002 | Roberts | 361/760 |
| 6,492,717 B1 | 12/2002 | Gore et al. | |
| 6,886,246 B2 | 5/2005 | Chung | |
| 7,008,240 B1 * | 3/2006 | Wang et al. | 439/76.1 |
| 7,063,561 B2 * | 6/2006 | Pabst | 439/498 |
| 7,154,758 B2 * | 12/2006 | Welling et al. | 361/764 |
| 7,237,724 B2 * | 7/2007 | Singleton | 235/492 |
| 2002/0126458 A1 | 9/2002 | Sasaki | |
| 2003/0047353 A1 | 3/2003 | Yamaguchi et al. | |
| 2005/0168339 A1 * | 8/2005 | Arai et al. | 340/572.8 |
| 2005/0168340 A1 * | 8/2005 | Mosher et al. | 340/572.8 |

* cited by examiner

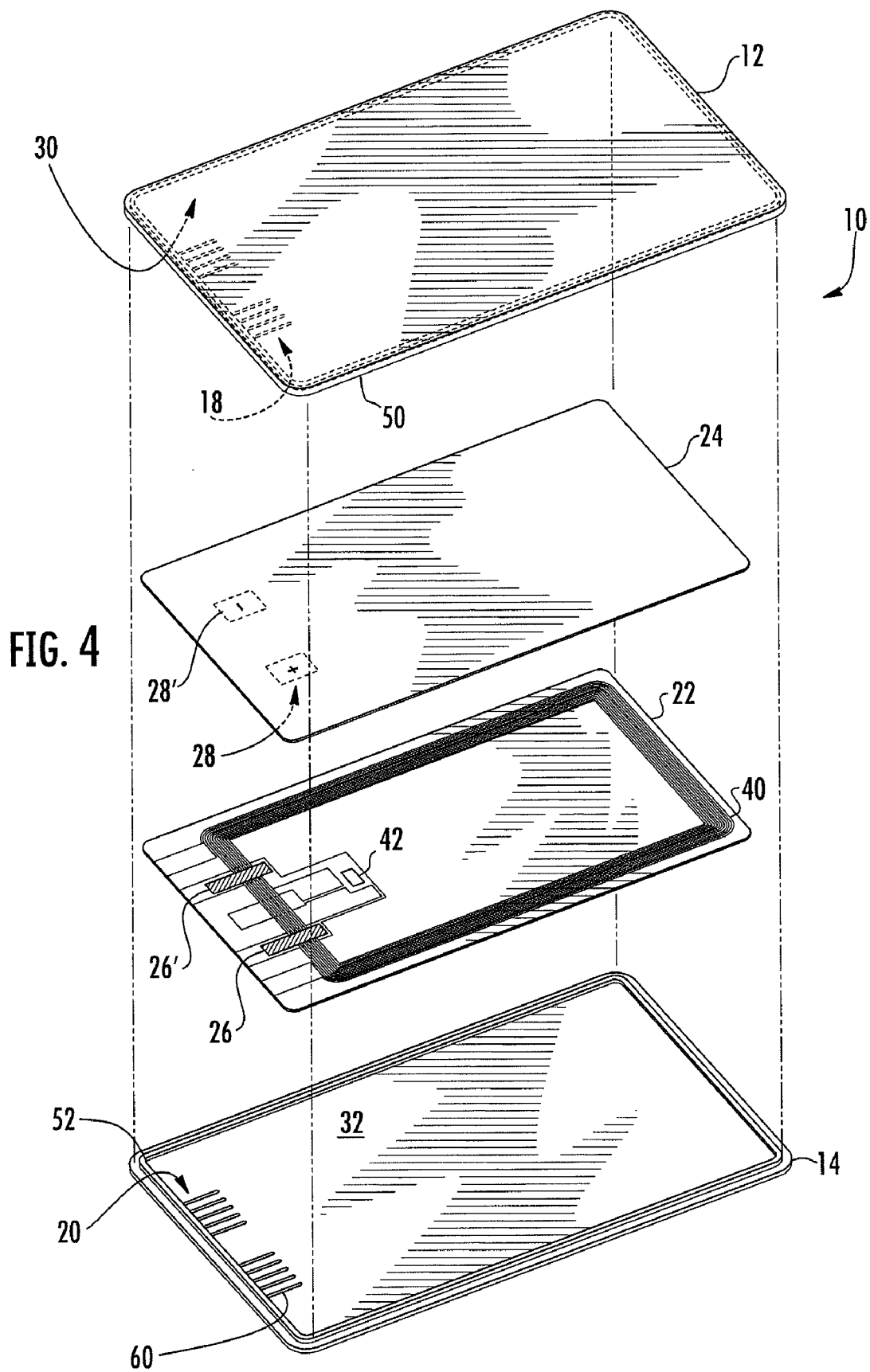

ELECTRONIC DEVICE HAVING IMPROVED ELECTRICAL CONNECTION

FIELD OF THE INVENTION

The invention relates generally to a method and apparatus for interconnecting electronic circuit components, and more particularly to a method and apparatus for interconnecting one or more flexible electronic circuits.

BACKGROUND OF THE INVENTION

Smart cards are small electronic devices that may be used to store, process, and transmit information and data. Smart cards are increasingly being used in a wide variety of applications including healthcare, banking, entertainment, transportation, food and product packaging, e-commerce, and personal identification. In one such application, smart cards are used to record and monitor various conditions and events. In many industries involving products that are sensitive to specific conditions it may be desirable to monitor environmental conditions, such as temperature, to which the products have been exposed. In particular, smart cards have found increasing use in the food industry to record and monitor conditions under which items such as perishable goods have been shipped and/or stored. Typical measurements may include temperature, relative humidity, light intensity, on/off, open/closed, voltage, pressure, and events over time. Smart cards may be programmed to take specific measurements at desired time intervals. Smart cards that are capable of measuring and recording one or more environmental conditions are commonly referred to as "data loggers."

Smart cards are typically about the size of a credit card and include a housing in which one or more electronic components are disposed. The electronic components may include a processor, electronic data memory, one or more sensors, a data display, and combinations thereof. In some smart cards, the electronic components may include an integrated circuit chip. Smart cards may include a battery component that provides power to the various electronic components. Smart cards for environmental monitoring may include one or more sensors that are capable of monitoring environmental conditions to which the smart card has been exposed.

Smart cards are typically used with a reader/writer that includes an external interface that is able to transmit information to or from the smart card. Some smart cards include electrical contacts or terminals which are used to make a direct electrical connection between electrical circuitry on or within the smart card and the external interface. Other smart cards may include a radio frequency (RF) antenna that can be used in combination with an external interface to communicate with an external interface. Communication between the smart card and an external interface may be used to activate, program, and send or retrieve data to and from the smart card. The use of radio frequency identification (RFID) technology in smart cards may help facilitate communication between the smart cards and an external card reader.

In some smart cards, the various electronic components may comprise flexible structures upon which electronic circuitry, e.g., processor, memory, and/or RF antenna, may be disposed. Such flexible circuits may comprise a polymeric substrate having electronic circuitry thereon. The electronic components typically include electrical contacts, e.g., electrically conductive traces, electrically conductive bond pads, terminal points, that are arranged so that the components may be electrically interconnected with each other.

In some previous flexible structures having two or more electronic components, electrical interconnection has been made between the devices by soldering or welding the respective electrical contacts together, or by attaching the respective electrical contacts with an electrically conductive adhesive. However, when the flexible structure is bent, the relatively rigid (as compared to the flexible structure) solder, weld or adhesive can break, resulting in failure or degradation of the electrical interconnection. Further, soldering or welding the respective electrical contacts together requires additional labor and materials, which may result in increases in cost. Additionally, many flexible electronic components may be made of low temperature plastic which undesirably melts at the temperatures necessary for soldering, welding or heating with an adhesive.

In some previous flexible structures having two or more electronic components, electrical interconnection has been made by forming holes through the main body of the card, the holes extending between the respective electrical contacts of the devices, then inserting conductive "studs" into the holes which are attached at either end to the respective electrical contacts by soldering, welding or use of an electrically conductive adhesive. However, when the flexible structure bends, the conductive studs do not, which may result in one or more of the studs breaking away from one or both of the electrical contacts, thereby breaking the electrical interconnection between the devices.

Thus, there still exists a need for an improved method of electronically connecting flexible circuits that provides simplicity and reliability.

BRIEF SUMMARY OF THE INVENTION

The present invention provides an apparatus and method of electrically interconnecting electronic components that may help overcome many of the problems discussed above. In one embodiment, the invention is directed to a method of electrically interconnecting two or more electronic components together by disposing the electronic components between two opposing plurality of protrusions that hold the electrical components together and thereby establish an electrical connection therebetween.

In one embodiment, the electronic components may be part of a flexible structure that permits the structure to adopt a non-planar geometry when it is positioned between the opposing sets of plurality of protrusions. In some embodiments, the electronic components may include processors, memory components, external interface components, including both wired and wireless, one or more sensor elements, display elements, such as an LCD display, power supplies, and the like, and combinations thereof.

In one embodiment, at least two electronic components that are to be electrically interconnected are positioned so that an electrical contact on one of the electrical components is disposed in an opposing face-to-face relation with an electrical contact of the other electrical component. The electrical components may then be positioned between a pair of surfaces that each have a plurality of protrusions extending therefrom in the direction of the electronic components. In one embodiment, each plurality of protrusions are each disposed opposite one another in an offset arrangement. The opposing sets of protrusions hold the electronic components together to form an electrical connection therebetween.

In another embodiment, the invention provides an electronic device having first and second housing members that define an interior space therebetween. The first housing member may include a first plurality of protrusions that extend towards the interior space, and the second housing member also include a second plurality of protrusions that extend toward the interior space opposite the first plurality of protrusions. In one embodiment, the first and second plurality of protrusions are disposed in an offset arrangement from each other. The offset opposing protrusions cause the electronic components to bend and adopt a deflected geometry when they are positioned between the opposing sets of protrusions. This bending results in the electronic components being biased against each other so that the electrical contacts on each electronic component are held together and electrically interconnected. As a result, in some embodiments, the opposing set of protrusions can be used to electrically interconnect a plurality of electrical components in the absence of clamping, adhesive, soldering, crimping, pinching, and the like. In addition, the opposing sets of protrusions may help provide a simplified method of electrically connecting two or more electrical components. Thus, the invention provides a method and apparatus that may help provide a reliable and simplified arrangement for electrically interconnecting two or more electronic components.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 4 is an exploded perspective view of the electronic device of FIG. 1; and

DETAILED DESCRIPTION OF THE INVENTION

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1:
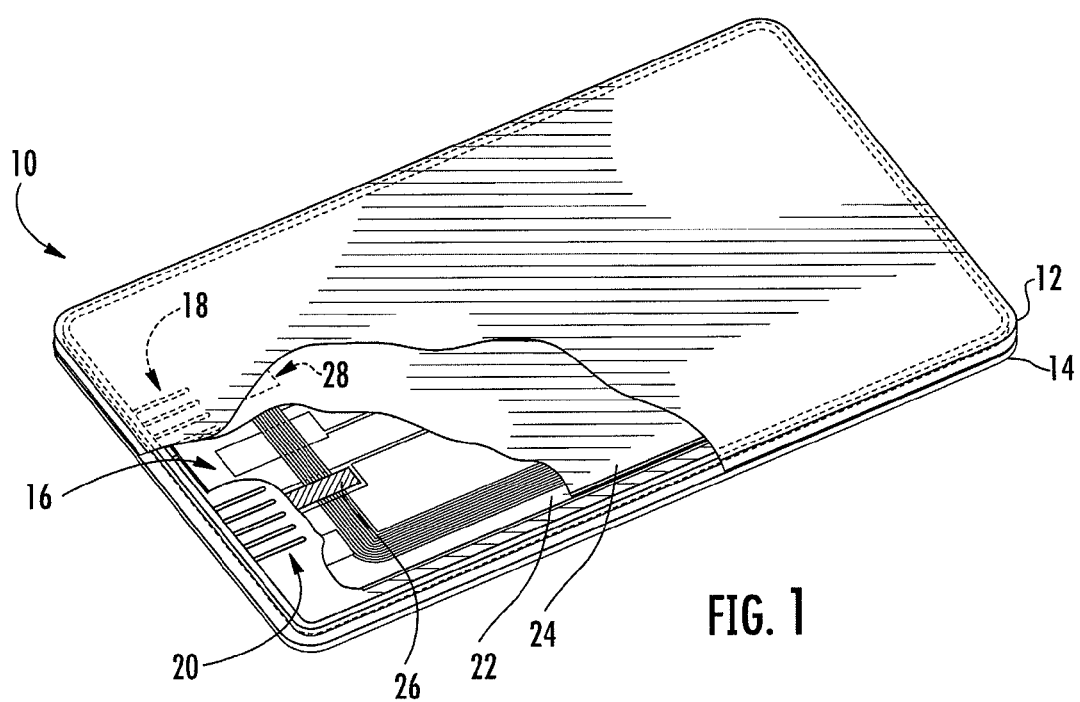
FIG. 1 is a perspective view of an electronic device that is in accordance with the invention wherein a portion of the electronic device has been removed for clarity.

With reference to FIG. 1, an electronic device having two or more electronic components that are electrically interconnected is illustrated and broadly designated as reference number 10. The electronic device 10 includes a first housing member 12 and a second housing member 14 that are attached together and configured to define an interior space 16 therebetween. The electronic device 10 includes first and second electronic components 22, 24 that are disposed in interior space 16 and that are capable of being electrically interconnected. Each electronic component may include an electrical contact or terminal that is capable of being electrically connected to an electrical contact or terminal on an adjacent electronic component. For example, in the illustrated embodiment, first electronic component 22 includes one or more electrical contacts 26 that face in the direction of second electronic component 24. Similarly, second electronic component 24 includes one or more electrical contracts 28 that face in the direction of first electronic component 24. In one embodiment, at least one electrical contact on electronic component 22 is disposed opposite an electrical contact on electronic component 24. The electronic components 22, 24 are biased against each other in an area adjacent to the opposing electrical contacts so that the electrical contacts are held together to form an electrical connection therebetween.

In one embodiment, the electronic device may be capable of performing one or more functions, for example, identification, monitoring, and/or tracking functions. In some embodiments, the electronic devices may include one or more internal electronic components that are capable of performing one or more functions. Such electronic components may include, for example, processors, memory components, external interface components (including both wired and wireless), sensor elements, display elements (such as an LCD display), power supplies, and the like, and combinations thereof. In addition the electronic components may include integrated circuits, transistors and diodes, and passive components such as resistors, capacitors and inductors, and the like. Examples of various types of electronic devices may include smart tags, smart cards, RF tags, RFID tags, wireless cards, wireless tags, contact cards, data loggers, tags, and the like.

In one embodiment, the electronic device may comprise an identification device that can be used for applications, such as credit cards, debit cards, security cards, cash cards, and driver's licenses. In other embodiments, the electronic device may include one or more sensors for monitoring various conditions to which the electronic device has been exposed. In one embodiment, the electronic device may include a RF antenna that may permit wireless communication between the electronic device and an external interface or reader. The electronic device may also include a processor and/or memory component for processing environmental measurements and for storing such measurements. In embodiments where the electronic component includes an RF antenna, information may be wirelessly transmitted to and from the electronic device.

Figure 2:
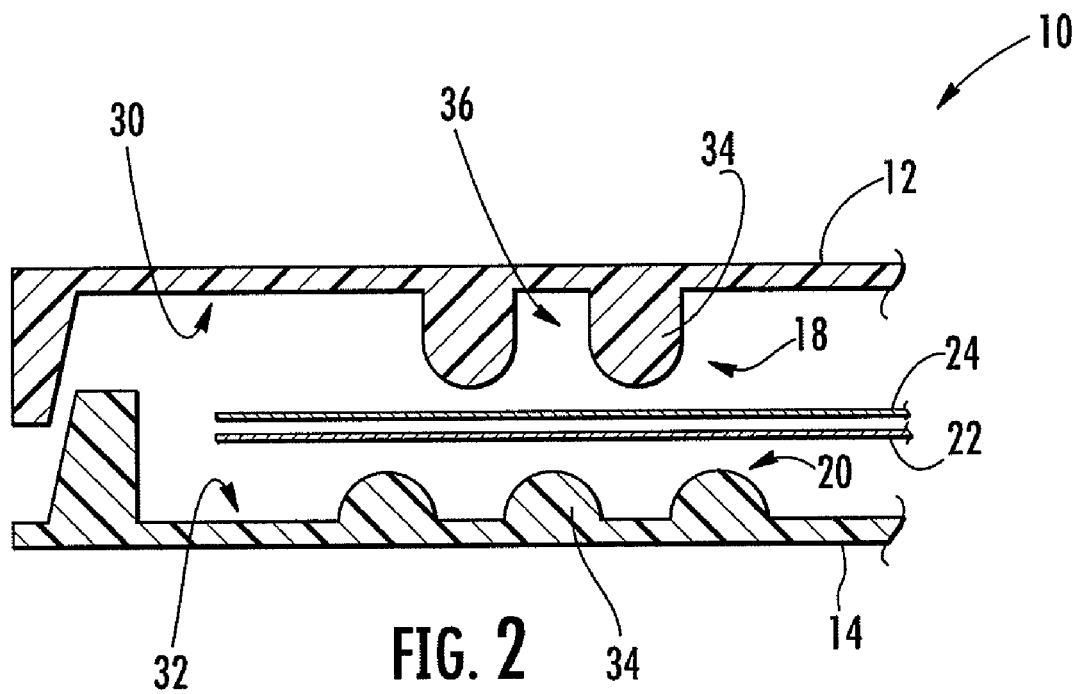
FIG. 2 is a cross-sectional side view of the electronic device in an unassembled state.
Figure 3:
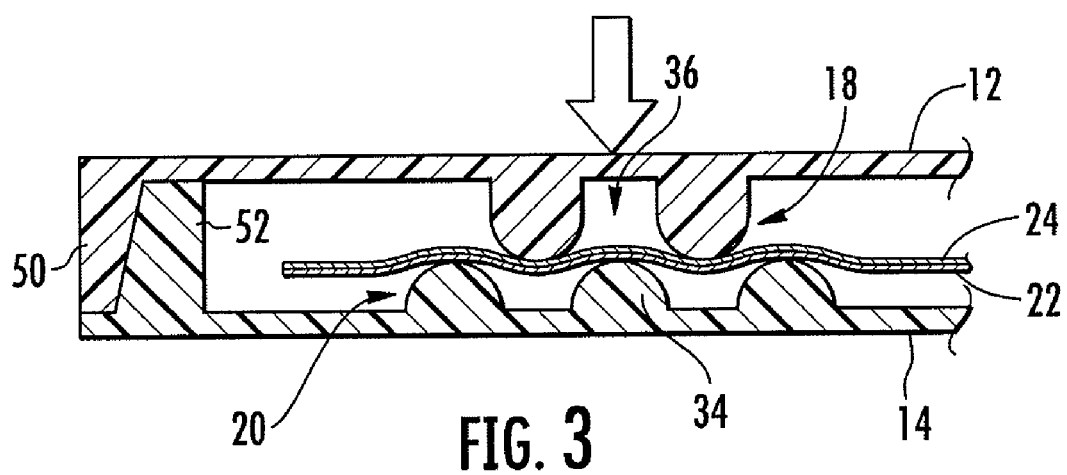
FIG. 3 is a cross-sectional side view of the electronic device in an assembled state.

Referring back to FIG. 1, in one embodiment, the first housing member 12 includes a first plurality of protrusions 18 that cooperate with a second plurality of protrusions 20 on the second housing member 14 to electrically connect components 22 and 24 with one another. As shown in FIGS. 2 and 3, the electronic device may include at least one set of opposing protrusions 18, 20 that each comprise a plurality of individual protrusions 34. The plurality of opposing protrusions 18, 20 cooperate to establish an electrical communication between the electrical components 22, 24 by holding the electronic components in intimate contact with each other in an area on the electrical components that is adjacent to the electrical contacts 26, 28 of each component. The arrangement and position of the cooperating protrusions 18, 20 is selected so that the electrical contacts of each electrical component are brought into electrical contact with each other when the electronic device is in an assembled state. In one embodiment, the opposing plurality of protrusions 18, 20 may be capable of electrically connecting two or more electrical components with each other in the absence of soldering, welding, crimping, or the use of other means that may apply a clamping pressure to the electrical components.

Figure 6:
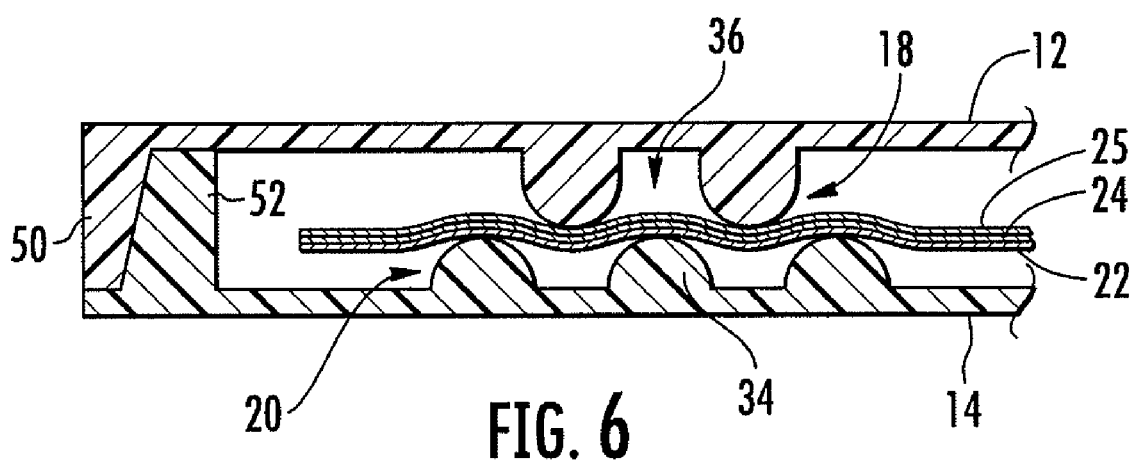
FIG. 6 is cross-sectional side view of the electronic device in which three electronic components are electrically interconnected.

In some embodiments, the electronic device 10 may include two or more sets of opposing plurality of protrusions. The number and placement of the opposing sets of plurality of protrusions may be selected so that opposing electrical contacts on each respective electrical component may be electrically interconnected to each other. For example, in one embodiment, the electronic device may include two electronic components that each includes at least two opposing electrical contacts. In this embodiment, the electronic device may include two sets of opposing protrusions that cause the electronic components to be electrically interconnected. In other embodiments, the number of opposing plurality of protrusions may be selected to electrically interconnect multiple electrical components, such as 2, 3, 4, 5, or more electrical components. For example, FIG. 6 shows three electronic components 22, 24, 25 that are electrically interconnected. It should be recognized that the placement of the opposing sets of protrusions is not limited to any particular position on the inner surface of each housing member.

As can best be seen in FIG. 2, the first housing member 12 includes an inner surface 30 from which the first plurality of spaced apart protrusions 18 extend in the direction of the interior space, and the second housing member 14 also includes an inner surface 32 from which the plurality of protrusion 20 extends in the direction of the interior space opposite the first plurality of protrusions. The plurality of protrusions 18, 20 on each housing member may be arranged so that they are disposed in an offset arrangement with the protrusions on the opposite housing member. The term "offset arrangement" generally includes orientations e.g., where the center of a protrusion is not directly opposed the center of an opposing protrusion or orientations where the centerline of a protrusion is not aligned with the centerline of an opposing protrusion.

In one embodiment, each individual protrusion 34 comprises a raised surface. The space between each pair of adjacent raised surfaces defines a gap 36. In one embodiment, an individual protrusion may be substantially aligned with a corresponding gap 36 on the opposite housing member (e.g., where the center of a protrusion is aligned opposite a gap on the opposing housing member). This results in the protrusions of one housing member being offset from the opposing protrusions on the other housing member. As a result, the protrusions 34 and gaps 36 cause the electronic components to bend when they are positioned between the opposing sets of protrusions 18, 20. This bending results in the electronic components being biased against each other so that the electrical contacts on each electronic component are held together to form an electrical interconnection. In some embodiments, the offset opposing gaps and protrusions permit electrical interconnection between two or more electronic components without applying a clamping or pinching force against the electrical components. For example, because the protrusions are not directly opposed to each other (e.g., no point-to-point contact between the opposing protrusions) they do not create isolated areas of compression between the electronic components. In one embodiment, at least one of the housing members includes two or more adjacent protrusions having a gap therebetween and the other housing member includes at least one protrusion that is aligned with this gap and that cooperate together to electrically interconnect two or more electrical components in the interior of the electronic device. In other embodiments, each opposing set of protrusions comprises a plurality of individual protrusions.

As discussed above, the opposing plurality of protrusions may be disposed in an offset arrangement with respect to each other. In one embodiment, the offset arrangement may include embodiments wherein a protrusion is partially aligned with an opposing protrusion provided that the center of the protrusion is not directly aligned with a center of an opposing protrusion and the protrusions are capable of electrically interconnecting the electrical components in the absence of applying an isolated pinching or clamping force to the electrical components. In other embodiments, the offset arrangement may include embodiments wherein the pair of opposing protrusions are completely offset from one another. For example, in some embodiments, a protrusion may be aligned with an opposing gap so that there is no alignment or overlap between the opposing pair of protrusions.

In one embodiment, the opposing protrusions impose a deflected geometry onto electrical components so that they adopt a slightly distorted shape. In this regard, FIG. 3 illustrates an embodiment wherein the portion of each electronic component that is disposed between the opposing sets of protrusions has adopted a "wave-like" shape. This deflected geometry causes the electronic components to be held against each other. As a result, electrical contacts on opposing electrical components within this deflected geometry are held against each so that the electrical components may be electrically interconnected.

The distance between the opposing plurality of protrusions may be selected so that the combined thickness of the electronic components causes them to adopt a deflected geometry when they are disposed between the opposing plurality of protrusions. In the context of the invention, the distance between the opposing plurality of protrusions refers to the average distance between two opposing planes that are each defined by the apexes of each plurality of protrusions. In one embodiment, the distance between the opposing protrusions may be selected so that the apexes of the opposing sets of protrusions are substantially coplanar. In some embodiments, the distance between the opposing protrusions may be selected so that at least a portion of the protrusion extends partially into an opposing gap 36 that exists between adjacent protrusions. In other embodiments, the distances between the opposing protrusions can be increased provided that the combined thickness of the electronic components is sufficient to cause the electronic components to adopt a non-planar geometry. In one embodiment, the distance between the opposing protrusions is the about same or less than the total thickness of the electronic components. In one embodiment the distance is at least 1.0 times or less the total thickness of the electronic components (e.g., 0.95, 0.90, 0.85, 0.80, 0.75, 0.70, 0.65, 0.60, 0.55, 0.50 times or less).

Figure 5A:
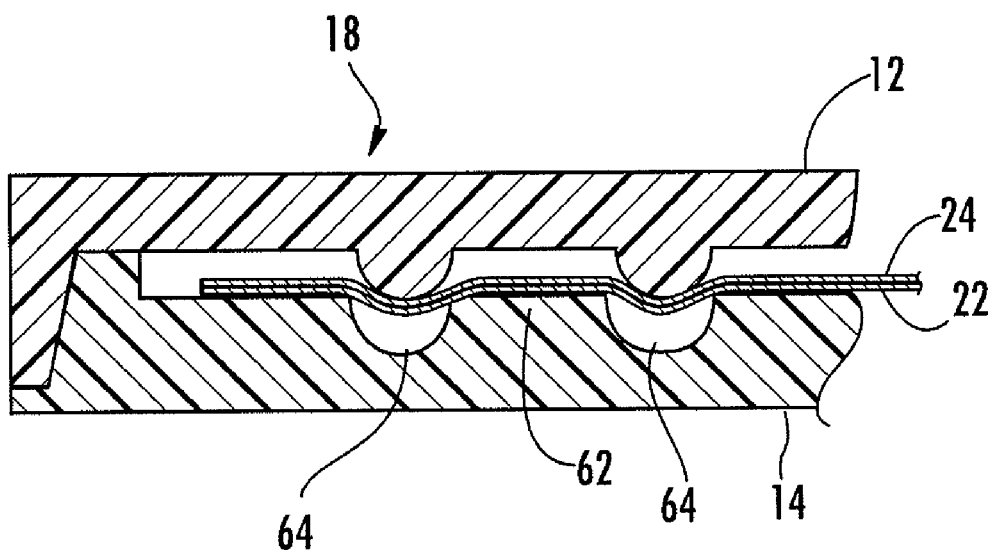
FIGS. 5A and 5B illustrate two exemplary protrusions having configurations that are in accordance with one aspect of the invention.
Figure 5B:
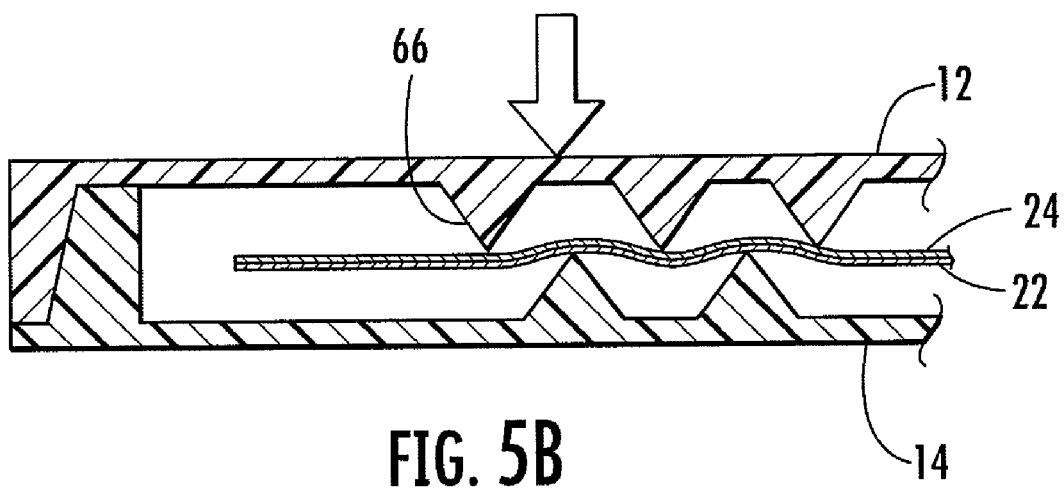

The protrusion may have a wide variety of shapes and configurations. For example, the protrusions 18, 20 illustrated in FIG. 4 have a ridge 60 shape. FIG. 5A illustrates an embodiment wherein at least one of the protrusions 62 comprises a raised surface that is disposed between two recesses 64. FIG. 5B illustrates an embodiment wherein the protrusions comprise a raised surface having a pointed 66 or peak-like shape.

In one embodiment, the electronic components may comprise a flexible structure. In other embodiments, a portion of the electrical component that is disposed between the opposing protrusions may comprise a flexible structure, and a portion not disposed between the protrusions may comprise a rigid or semi-rigid structure. In this embodiment, the opposing protrusions cause the flexible portion of the electrical components to conform to the deflected geometry. Electrical components having a flexible structure may more readily conform to the deflected geometry than an electrical component having a more rigid structure. In some embodiments, the flexible structures may comprise a flexible material having a tendency to adopt a planar geometry. As a result, when the flexible structures are disposed in a deflected geometry they may have a natural tendency to reestablish a planar orientation. This tendency towards a planar orientation causes the flexible structures in a deflected geometry to be held against each other as they attempt to reestablish a planar orientation. This causes the opposing electrical contacts on the electronic components to be electrically interconnected.

The flexible structure of the electronic components may comprise a resilient polymeric material. Suitable polymeric materials for use in flexible circuits are known to one of ordinary skill in the art, e.g., polyethylene terephthalate. In one embodiment, the flexible structure may have a thickness from about 1 to 10 mils. In some embodiments, the flexible structure may comprise a material upon which circuitry may be applied through printing or adhesive bonding, for example.

With reference to FIG. 4, an exploded perspective view of one embodiment of electrical device 10 is illustrated. As shown, electrical components 22, 24 are disposed in the interior space between the first and second housing members 12, 14. In this embodiment, electronic component 22 includes two electrical contacts 26, 26' that are each in a face-to-face orientation with corresponding electrical contacts 28, 28' on electrical component 24. The inner surfaces of the first and second housing member each include two sets of plurality of protrusions 18, 20 that are aligned with the opposing electrical contacts 26, 28. As discussed above, the opposing plurality of protrusions hold the electrical components against each other and thereby cause the contacts 26, 28 to be electrically interconnected.

As discussed above, the electronic components may include sensor elements, display elements, an RF antenna, memory components, processors, control circuits, power supplies, and the like. In some embodiments, the electronic components may include one or more sensors for measuring one or more environmental conditions to which the electronic device has been exposed. Exemplary environmental conditions that may be monitored include, but are not limited to, temperature, relative humidity, light intensity, on/off, open/closed, voltage, pressure, shock/vibration, and other events over time. In one embodiment, the electronic component may comprise a circuit having a control circuit and an RF antenna. In other embodiments, the electronic component may comprise a power supply, such as a battery, that may be electrically interconnected to an adjacent electronic component. In this regard, FIG. 4 illustrates an embodiment wherein electronic component 22 comprises a flexible circuit having both an RF antenna 40, and a processor/memory component 42, and a sensor element. The processor/memory component may comprise a single integrated structure or may comprise separated components that are disposed on a single electronic component or on two or more electronic components. Electronic component 24 may comprise a power supply, such as a battery, that is electrically interconnected to electronic component 22 via opposing pairs of electrical contacts on each respective electronic component. In one embodiment, the sensor element may be capable of taking and recording temperature measurements.

In one embodiment, the electronic device may include a memory component that can be configured to store data and information including, but not limited to, recorded measurements, financial information, programming and operational instructions for the electronic device, identification information, tracking information, and the like. In some embodiments, the memory may be configured to buffer data that is measured by the electronic device, such as flash memory. Flash memory refers generally to a type of nonvolatile memory that can be erased and reprogrammed in units of memory called blocks. The capacity of the memory component can be varied depending upon the desired amount of data that can be stored before downloading the data into an external computer or similar device. In some embodiments the capacity of the memory component may comprise 64K, 128K, 256K, 512K, or greater memory blocks.

In one embodiment, the first and second housing members may define an electronic device that is about the size of a credit card. In some embodiments, the first and second housing members may comprise a material having a rigid or semi-rigid structure. In other embodiments, the housing member may have a more flexible structure.

The first and second housing members may be attached together in a variety of ways provided that the electronic components therein are held between the cooperating sets of protrusions. For example, the first and second housing members may be attached together utilizing RF bonding, heat welding, ultrasonic bonding, adhesive bonding, mechanical fastening, and the like. With reference to FIG. 4, the upper housing member 12 may include a raised surface 50 that extends outwardly from inner surface 30 about the periphery of the first housing member. Similarly, the second housing member 14 may also include a raised surface 52 that extends outwardly from the inner surface 32 of the second housing member. As shown in FIG. 3, the raised surfaces 50 and 52 may be offset from one another (i.e., not directly opposed to each other) as a means to ensure proper alignment between the upper and lower housing members. The electronic components may be enclosed in the resulting interior space. In some embodiments, the raised surfaces can be attached to each other with RF bonding, heat welding, ultrasonic bonding, and/or adhesive bonding. In other embodiments, the housing members may be mechanically fastened together, for example with a snap-like mechanism, screw mechanism, or the like. In one embodiment, the first and second housing members may comprise a unitary body wherein the first and second housing members are hingedly connected to one another. In this embodiment, the first and second housing members may be molded from a single piece of material, such as plastic.

In one embodiment, the electronic device may be an electronic monitoring device. Electronic monitoring devices that may be useful in the invention include small portable electronic devices, such as data loggers, that can be programmed to collect and record specific measurements. The electronic devices are typically battery powered and may comprise a microprocessor, instruments for taking measurements, and recordable storage medium for storing data. Typical measurements include, for example, temperature, relative humidity, light intensity, on/off, open/closed, voltage, pressure, shock/vibrations, and other events over time. In some embodiments, the data logger devices can be about the size and shape of a credit card. Card shaped electronic devices can be deployed in a wide variety of applications where small size may be desirable. The electronic devices in some embodiments may be reused multiple times.

The electronic device may include a radio frequency (RF) transceiver that can wirelessly send and receive data between the electronic device and a reader. The electronic device can also include a radio frequency identification (RFID) communication means or interface that can enable wireless communication with the electronic device. In one embodiment, the electronic device may employ radio frequency identification (RFID) communication protocols to activate, program, and send or retrieve data to and from the electronic device. The use of RFID technology in electronic devices, such as data loggers, may permit the stored data to be quickly retrieved from the devices. For instance, an RFID reader in communication with a computer can be used to activate and retrieve data from an electronic device at various points throughout a distribution system. To retrieve the information, the electronic device may be connected to a computer or brought into close proximity with an RFID reader.

In some embodiments, the electronic devices may be adapted to monitor and record a wide variety of conditions, such as those discussed above. Electronic devices can be activated in a wide variety of ways. In some embodiments, the electronic device may be manually activated by pushing a button or triggering a switch. In other embodiments, the electronic device can be activated through wired or wireless communication with a computer or reader, such as a RFID reader. Possible functions and uses of electronic devices are described in U.S. Pat. No. 5,313,848; 6,320,512; and 6,411,916.

In one embodiment, the electronic device may be activated or programmed by connecting it directly to a computer or reader that can be used to send and retrieve data to and from the electronic device. In some embodiments, the electronic devices can also be activated by manual operation, such as a switch or push button. In embodiments where the electronic device is capable of monitoring one or more conditions, the electronic device may be positioned or deployed in a desired location for data gathering after is has been activated. The electronic device can be configured to record each measurement and store it in memory. In some embodiments, the electronic device may also be capable of recording the date and time at which the measurement was taken. At a desired time, the data contained within the electronic device can be retrieved by reconnecting the data logger to a computer or similar device.

In one embodiment, the electronic device may be used to monitor environmental conditions such as temperature exposure of a wide variety of items including, but not limited to, pharmaceuticals, food products such as meats, produce, and dairy products, electronics, chemicals, cosmetic products, biological products, and the like. An item that is to be monitored includes not only individual items such as a package, box, or pallet-load, but can also include collections of more than one type of item.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An electronic device comprising:
   first and second housing members attached together in an opposed arrangement to define an interior space therebetween,
   the first housing member having a plurality of protrusions extending toward the interior space,
   the second housing member having at least one cooperating protrusion extending toward the interior space and disposed in an offset arrangement from the plurality of protrusions of the first housing member; and
   first and second electronic components disposed in the interior space between the housing members, the first and second electronic components each including an electrical contact, wherein the plurality of protrusions and the at least one cooperating protrusion cooperate to hold the first and second electronic components to form an electrical connection between the electronic contacts of the first and second electronic components, wherein the plurality of protrusions on the first housing member are spaced apart from each other to define a gap between adjacent protrusions, and wherein said at least one protrusion on the second housing member is configured and arranged so that the at least one protrusion is aligned with said gap.

2. An electronic device according to claim 1, further comprising a third electronic component that is electrically connected to at least one of the first or second electronic components.

3. An electronic device according to claim 1, wherein the electrical contacts of the first and second electronic components are disposed in a face-to-face relationship.

4. An electronic device according to claim 1, wherein the distance between the plurality of protrusions of the first housing member and the at least one protrusion on the second housing member is no greater than the total thickness of the first and second electronic components.

5. An electronic device according to claim 1, wherein the plurality of protrusions of the first housing member and the at least one protrusion and the second housing member are completely offset from each other.

6. An electronic device according to claim 1, wherein the plurality of protrusions and the at least one protrusion each comprise a plurality of ridges.

7. An electronic device according to claim 1, wherein the plurality of protrusions of the first housing member and the at least one protrusion of the second housing member deflect at least a portion of the electronic components so as to create an electrical connection between the components.

8. An electronic device according to claim 7, wherein the deflected portions of the electronic components have a wave-like shape.

9. An electronic device according to claim 7, wherein the electronic components comprise a flexible circuit.

10. An electronic device according to claim 1, wherein the electronic components include one or more of a battery component, an integrated circuit, a sensor element, a processor, an RF antenna, a memory component, a display component, and combinations thereof.

11. An electronic device according to claim 1, wherein the electronic components are in electrical communication in the absence of clamping, pinching, or crimping.

12. An electronic device according to claim 1, wherein the electronic components are in electrical communication in the absence of soldering, welding, or adhesive bonding.

13. An electronic device according to claim 1, wherein the first and second housing members are attached together with an adhesive bond, heat seal bond, ultrasonic bond, RF bond, or a mechanical fastener.

14. An electronic device according to claim 1, wherein at least one of the electronic components comprises a battery, and at least one of the electronic components includes an RF antenna and at least one sensor element that is capable of taking temperature measurements.

15. An electronic device for monitoring temperature conditions comprising:
   first and second housing members attached together in an opposed arrangement to define an interior space therebetween, the first housing member having a plurality of protrusions extending toward the interior space, the second housing member having at least one cooperating protrusion extending toward the interior space and disposed in an offset arrangement from the plurality of protrusions of the first housing member, wherein said plurality of protrusions are spaced apart from each, and wherein said at least one protrusion is configured and arranged so that it is aligned with a space between at least two of the plurality of protrusions; and a battery disposed in the interior space of said housing members and having a surface with at least one electrical contact thereon; and an electronic component disposed in the interior space of said housing members and having a surface with at least one electrical contact thereon, the electronic component including a processor, RF antenna, and a temperature sensor, wherein the at least one electrical contact of the battery and the electronic component are disposed in an opposing face-to-face relation and held together to form an electrical connection.

16. The electronic device according to claim 15, wherein the electronic component comprises an integrated circuit.

17. The electronic device according to claim 15, wherein in a portion of the battery and the electronic component that is disposed between the cooperating opposed protrusions comprises a flexible structure.

18. The electronic device according to claim 15, wherein the cooperating opposed protrusions causes at least a portion of the battery and electronic component to be deflected into a non-planar geometry.

19. The electronic device according to claim 15, wherein the battery and electronic component are electrically interconnected in the absence of clamping or soldering.

20. The electronic device according to claim 15, wherein the battery and the electronic component include at least two electrical contacts that are disposed in a face-to-face relation.

21. A method of electrically interconnecting electronic components that each have at least one electrical contact on a surface thereof, the method comprising:

positioning an electrical contact of one of the electrical components in an opposing face-to-face relation with an electrical contact of the other electrical component;

positioning the electrical contacts between a pair of opposing surfaces that each have a plurality of protrusions extending therefrom in the direction of the electronic components, the pair of plurality of protrusions being disposed opposite one another in an offset arrangement such that at least one protrusion on one of the surface is aligned with a gap that exist between a pair of adjacent protrusions on the opposite surface; and holding the electrical contacts together between the pair of plurality of protrusions so that the electrical contacts in a face-to-face relation are electrically interconnected to one another.

22. The method according to claim 21, wherein the holding step further comprises deflecting at least a portion of the electronic components into a non-planar geometry.

23. The method according to claim 21, wherein the electronic components include one or more of a battery component, an integrated circuit, a sensor element, a processor, an RF antenna, a memory component, a display component, and combinations thereof.

* * * * *

UNITED STATES PATENT AND TRADEMARK OFFICE
CERTIFICATE OF CORRECTION

| | |
|---|---|
| PATENT NO. | : 7,551,448 B2 |
| APPLICATION NO. | : 11/343296 |
| DATED | : June 23, 2009 |
| INVENTOR(S) | : Roberts |

It is certified that error appears in the above-identified patent and that said Letters Patent is hereby corrected as shown below:

Column 12,

Line 18, "surface" should read --surfaces--;

Line 19, "exist" should read --exists--.

Signed and Sealed this

Thirteenth Day of October, 2009

David J. Kappos
*Director of the United States Patent and Trademark Office*